(12) United States Patent
Burdorf et al.

(10) Patent No.: US 6,463,403 B1
(45) Date of Patent: *Oct. 8, 2002

(54) SYSTEM AND METHOD FOR PROCESS MATCHING

(75) Inventors: James Burdorf, Tualatin, OR (US); Christophe Pierrat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/460,565

(22) Filed: Dec. 14, 1999

Related U.S. Application Data

(62) Division of application No. 09/031,397, filed on Feb. 26, 1998, now Pat. No. 6,033,814.

(51) Int. Cl.[7] .......................... G06F 9/455; G06F 17/50
(52) U.S. Cl. ............................ 703/22; 703/14; 716/19
(58) Field of Search ...................... 703/13, 22; 700/28, 700/32, 38; 706/14, 45; 716/2

(56) References Cited

U.S. PATENT DOCUMENTS

| | | | | |
|---|---|---|---|---|
| 5,394,322 A | * | 2/1995 | Hansen ........................ 364/148 |
| 5,783,341 A | | 7/1998 | Uzawa ......................... 430/22 |
| 5,814,783 A | * | 9/1998 | Harville et al. ............. 219/110 |
| 5,818,583 A | * | 10/1998 | Sevick-Muraca et al. ... 356/336 |
| 5,825,645 A | * | 10/1998 | Konar et al. ........... 364/148.01 |
| 5,879,845 A | | 3/1999 | Takahashi ..................... 430/30 |
| 5,956,495 A | * | 9/1999 | Kahle et al. ........... 395/500.44 |
| 6,033,814 A | * | 3/2000 | Burdorf et al. ............... 430/30 |
| 6,085,183 A | * | 7/2000 | Horn et al. ................... 706/45 |
| 6,097,433 A | * | 8/2000 | Kawai et al. ............... 348/315 |

* cited by examiner

Primary Examiner—Russell Frejd
(74) Attorney, Agent, or Firm—Schwegman, Lundberg, Woessner & Kluth, P.A.

(57) ABSTRACT

A computer-implemented method for matching parameters of outputs generated by a first and second process. The first process generates a first output having a characteristic measurable by a first parameter, and the second process generates a second output having the characteristic measurable by a second parameter. A computer having a processing unit and memory is provided. The computer generates a first model of the first parameter for the first process and a second model of the second parameter for the second process. The computer generates a first simulated output of the first process using the first model. A correction, which is a function of the second model and which compensates for the effect of the second process on the second parameter, is applied to the first simulated output to obtain a corrected output. The second process is applied to the corrected output to generate with the computer thereby a third output matching the first parameter of the first output.

24 Claims, 4 Drawing Sheets

SYSTEM AND METHOD FOR PROCESS MATCHING

This application is a Divisional of U.S. Ser. No. 09/031,397, filed Feb. 26, 1998, now U.S. Pat. No. 6,033,814.

FIELD OF THE INVENTION

This invention relates to photolithography. More particularly, this invention relates to the changing of photolithographic processes in the fabrication of integrated circuit parts.

BACKGROUND OF THE INVENTION

Photolithography is one method used to produce integrated circuit parts for semiconductor chips. Photolithography consists of processing substrate wafers with stepper machines that have been loaded with photomasks. This processing fabricates hundreds of integrated circuit parts on each wafer. The microscopic detail of the circuits created on the wafers makes photolithography a very exacting manufacturing method. Just a small change in the setup of the equipment or in one of the operating variables can drastically alter the resulting wafers.

However, in the course of production, one may wish to change the process. For example, although a current process may be providing for yields with good critical dimension behavior, the depth of focus may be unacceptable. A new process, using a different illumination setup may be desired. Altering the illumination may improve the depth of focus. The alteration may, however, cause a decline in critical dimension behavior. Other behaviors may also be of concern, including those caused by the photoresist process, etch process, or mask process.

What is needed is a process matching method which would allow the photuoithography process to be changed without introducing variances within the resulting wafer images. The wafer image from the new process should be the same as the initial wafer image. In such a system, the results of the primary process are matched to the results of a secondary process.

One useful tool for improving a wafer image is optical proximity effect correction ("OPC"). OPC is a misnomer since the term now encompasses not only optical proximity-effect correction, but also etch proximity effect correction and all other forms of corrections to proximity effects. In OPC, a correction is made to a photomask design to compensate for dimensional and positional inaccuracies resulting from optical or etch effects. It is well known that there are several ways to accomplish OPC. One way is by a rule-based system. In such a system, a pattern for a photomask is analyzed by a series of rules, which isolate and adjust the problematic edges. A wafer printed from the OPC-corrected pattern should result in a flat printed "critical dimension vs. environment" response based on proximity.

A model-based system is a second type of OPC. A model is a mathematical description of a system. In a photolithography system, a model can describe optical, optical through resist, or other system. Regardless of the type of system described, there are generally two types of models. A theoretical model relies on the pure science involved in the system. Often, a theoretical model will be used to describe optical systems. Otherwise an empirical model can be used. In an empirical model, copious measurements are compiled and are then used to generate a set of formulae describing the behavior of the system.

In OPC, first, a simulation is made by applying the photomask pattern to the model. The resulting value is a prediction on how the pattern will print on the wafer. The prediction is the intensity return value. If normalized to a scale of 1, an intensity return value of 0 indicates chrome and a value of 1 indicates quartz. After obtaining the resulting value, then the factor of change needed to compensate for the proximity effect is calculated. In general, a threshold is determined, which is the intensity that is required to print on the wafer. For positive tone resist, above threshold equals clear substrate, below threshold equals resist. Then the intensity return value from the simulation is subtracted from the threshold value to find the intensity difference. This difference is then used to find the physical offset necessary to correct the pattern. This OPC method is repeated at close intervals throughout the pattern, resulting in a corrected photomask pattern.

SUMMARY OF THE INVENTION

A computer-implemented method for matching parameters of outputs generated by a first and second process. The first process generates a first output having a characteristic measurable by a first parameter, and the second process generates a second output having the characteristic measurable by a second parameter. A computer having a processing unit and storage is provided. The computer generates a first model of the first parameter for the first process and a second model of the second parameter for the second process. The computer generates a first simulated output of the first process using the first model. A correction, which is a function of the second model and which compensates for the effect of the second process on the second parameter, is applied to the first simulated output to obtain a corrected output. The second process is applied to the corrected output to generate with the computer thereby a third output matching the first parameter of the first output.

DETAILED DESCRIPTION

In the following Detailed Description, reference is made to the accompanying drawings which form a part hereof and in which is shown by way of illustration specific embodiments in which the invention may be practiced. These embodiments are described in sufficient detail to enable those skilled in the art to practice and to use the invention, and it is to be understood that other embodiments may be utilized and that changes may be made without departing from the scope of the present invention. The following Detailed Description is, therefore, not to be taken in a limiting sense and the scope of the invention is defined by the appended claims. In the figures, elements having the same number perform essentially the same functions.

Figure 1A:
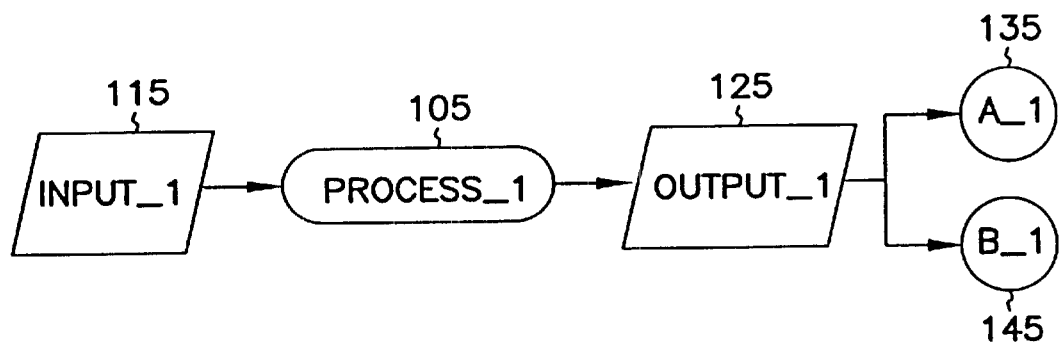
FIGS. 1A and 1B are flowcharts of two processes.
Figure 1B:
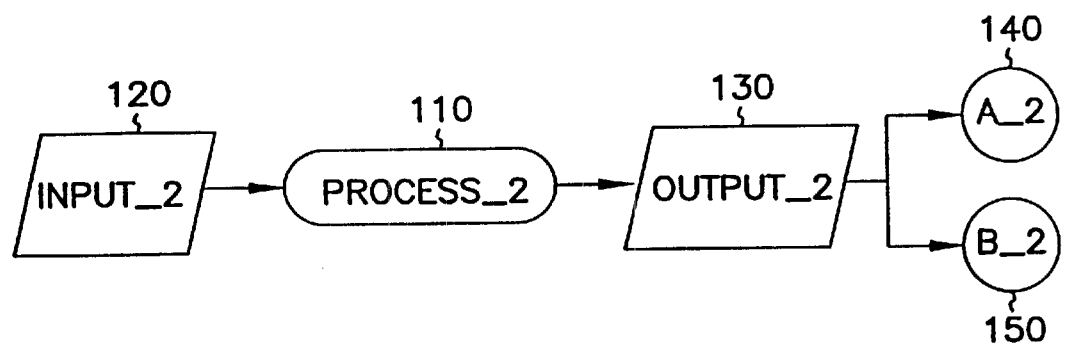

The present invention permits a change in process while maintaining the same wafer image, thus allowing a migration from one process to another with wafer image continuity. Process matching is the method of achieving a desired output of a process based on the another process which achieves the desired output. For example, FIG. 1 is a flowchart showing two processes, process_1 105 and process_2 110. Process_1 105 accepts input_1 115 and generates output_1 125. Similarly, process2 110 accepts input_2 120 and generates output_2 130. These processes can be symbolized with the notation:

OUTPUT_1=PROCESS_1(INPUT_1)

OUTPUT_2=PROCESS_2(INPUT_2).

A process's effectiveness can be gauged by the values of any of a number of parameters applied to the output produced for a given characteristic. In FIG. 1, process_1 's effectiveness can be gauged by parameters A_1 135 and B_1 145. Likewise, the effectiveness of process_2 is measured by the parameters A_2 140 and B_2 150. In a situation where parameter A_1 135 is satisfactorily achieved in output_1 125 by process_1 105, and where there is a second process (process_2 110), which results in a desired level of parameter B_2 150, but not A_2 140 (assuming input_1 115 and input_2 120 are equal), one of the goals of the present invention is to modify the input to process_2 110 so that output_2 130 results in an A_2 140 parameter as good as A_1 135. The matching of these processes can be written as:

OUTPUT_1=PROCESS_1(INPUT_1): A_1=good
B_1=bad
OUTPUT_2=PROCESS_2(INPUT_2): A_2=bad
B_2=good
OUTPUT_2=PROCESS_MATCHING(INPUT_2):
A_2≈A_1=good
B_2=good Although there are several situations in which process matching is useful, one exemplary use is in the field of semiconductor fabrication by photolithography. While building semiconductor wafers, a change in setup variables, such as a change in the illuminator, causes the wafer image produced from a photomask or reticle to vary. However, sometimes such a change will improve the value of one parameter while decreasing the value of another. The present invention allows a process to be introduced without causing a change in the wafer image with respect to a particular parameter. In addition to supporting a photolithographic process, other processes supported by the present invention include, but are not limited to the following: an ion projection process, an x-ray projection process and an e-beam projection process.

Two parameters of a wafer image which can be used to measure the effectiveness of the manufacturing process are critical dimension behavior and depth of focus. Process_1 105 could be a set-up using on-axis illumination. The output_1 125 of this process is the wafer image. This wafer image could have a good critical dimension behavior but a poor depth of focus (i.e., A_1=good, B_1=bad). However, the wafer image output resulting from the use of off-axis illumination (process_2 1 10) might improve the depth of focus (i.e., B_2=good) but not provide for quality critical dimension behavior (A_2=bad). By using process_2 110 instead of process_1 105, the favorable A_1 parameter 135 would be lost. The goal of process matching in this example is to transform input_2 120 so that the behavior of process_2 110 is good, i.e., so that the use of off-axis illumination improves the depth of focus (B_2 150) without degrading the critical dimension behavior parameter (A_2 140).

Process matching is accomplished through the unconventional uses of OPC and simulation. Traditionally, simulation is used upon input data, such as a photomask pattern, to predict how the pattern will print on the wafer based on a given model. Then OPC corrects the photomask pattern by adjusting the edges so that when the pattern is printed on the wafer, the proximity effect is mitigated. Symbolically, by using the SIM-subscript to denote "simulation", simulation is:

OUTPUT_1$_{sim}$=PROCESS_1$_{sim}$(INPUT_1).

At any point in the pattern, the offset value amounting to the physical offset can be calculated. OPC involves adjusting the pattern by the offset value so that the wafer image reflects the photomask pattern correctly. For example, suppose a simulated point ("X1") on an edge in the pattern has an intensity return of 0.30. If the threshold is 0.32, then the intensity difference is 0.02 (e.g., 0.32−0.30=0.02). If the contour shows that at point X1 there is 300 nanometers of slope per intensity value, then the physical offset value is 6 (e.g., 300×0.02=6). This indicates that although it is desired that the edge falls at X1, because of the offset, the edge is really falling at (X1−6). The offset value is 6 here and thus the OPC compensation is to move the original edge of the pattern up by 6.

Figure 2:
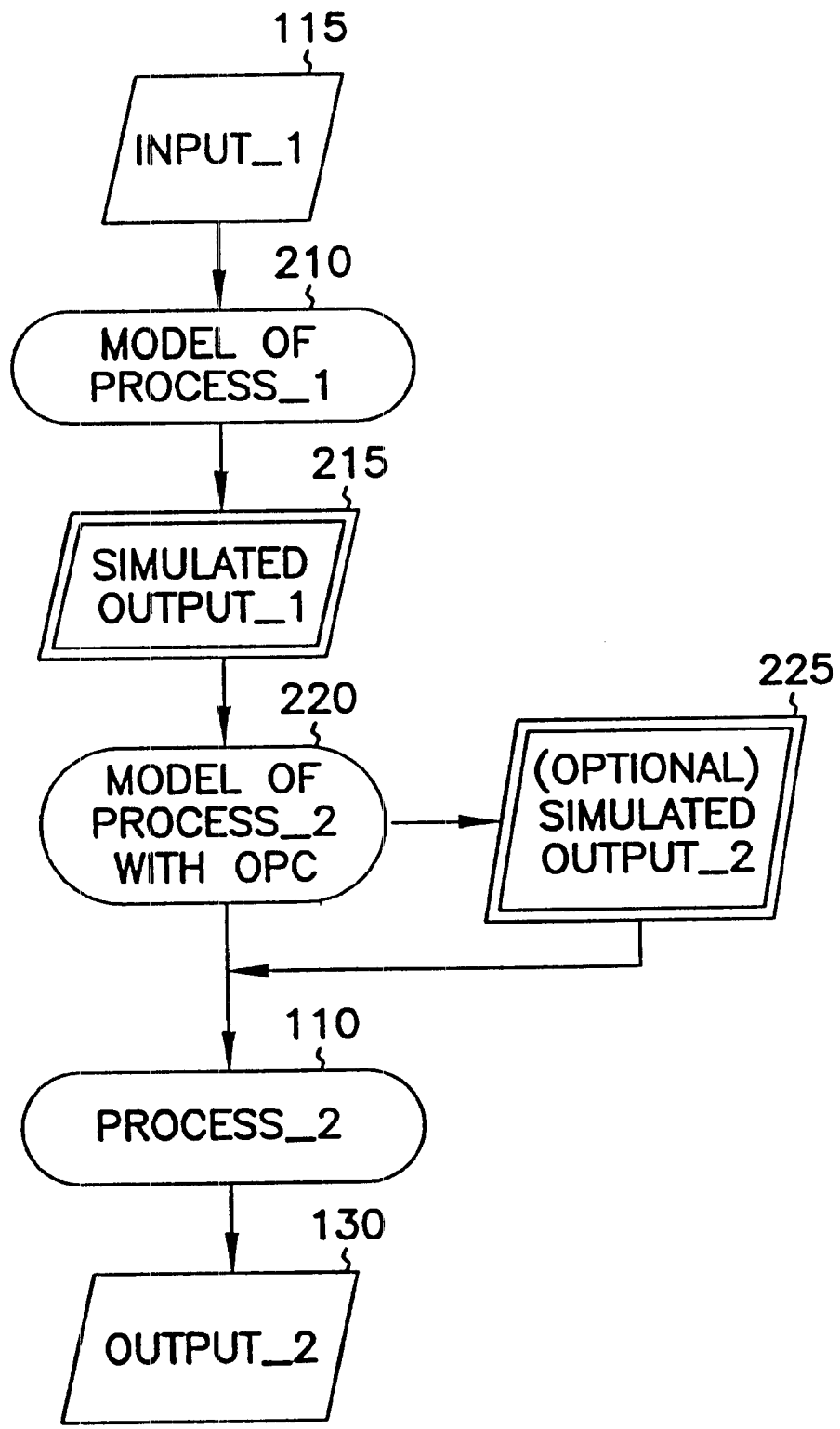
FIG. 2 is a flowchart showing a method of process matching.

FIG. 2 is a flow chart showing process matching applied to FIG. 1's process_1 105 and process_2 110. In FIG. 2, at step 210, a simulation model of process_1 is applied to input_1 115. The simulation produces output_1$_{sim}$ 215 and indicates where the edge is actually printing. The simulated output can be a three-dimensional image for a given contour level. Instead of correcting the input data to obtain the desired output data, as is usually done in OPC, the output data is stored without correction. Then at step 220, instead of using the original pattern (i.e., input_2 120) as input for process_2 110, the method uses the output generated from the model of process_2 with OPC (from step 220) resulting in output_2 130. As an optional step, the simulated output_2 225 can be generated for verification purposes. This output_2 130 is the same as the output_2 130 from FIG. 1, except both parameters A_2 140 and B_2 150 are good.

Another way to formulate this method of process matching is by:

OUTPUT_2=PROCESS_2 [PROCESS_2$_{sim}$
[PROCESS_1$_{sim}$(INPUT_1)]$^{-1}$];
THEREFORE: IF (PROCESS_2 ≈PROCESS_$_{2sim}$)
THEN (OUTPUT_2≈PROCESS_1$_{sim}$(INPUT_1)).

Figure 3:
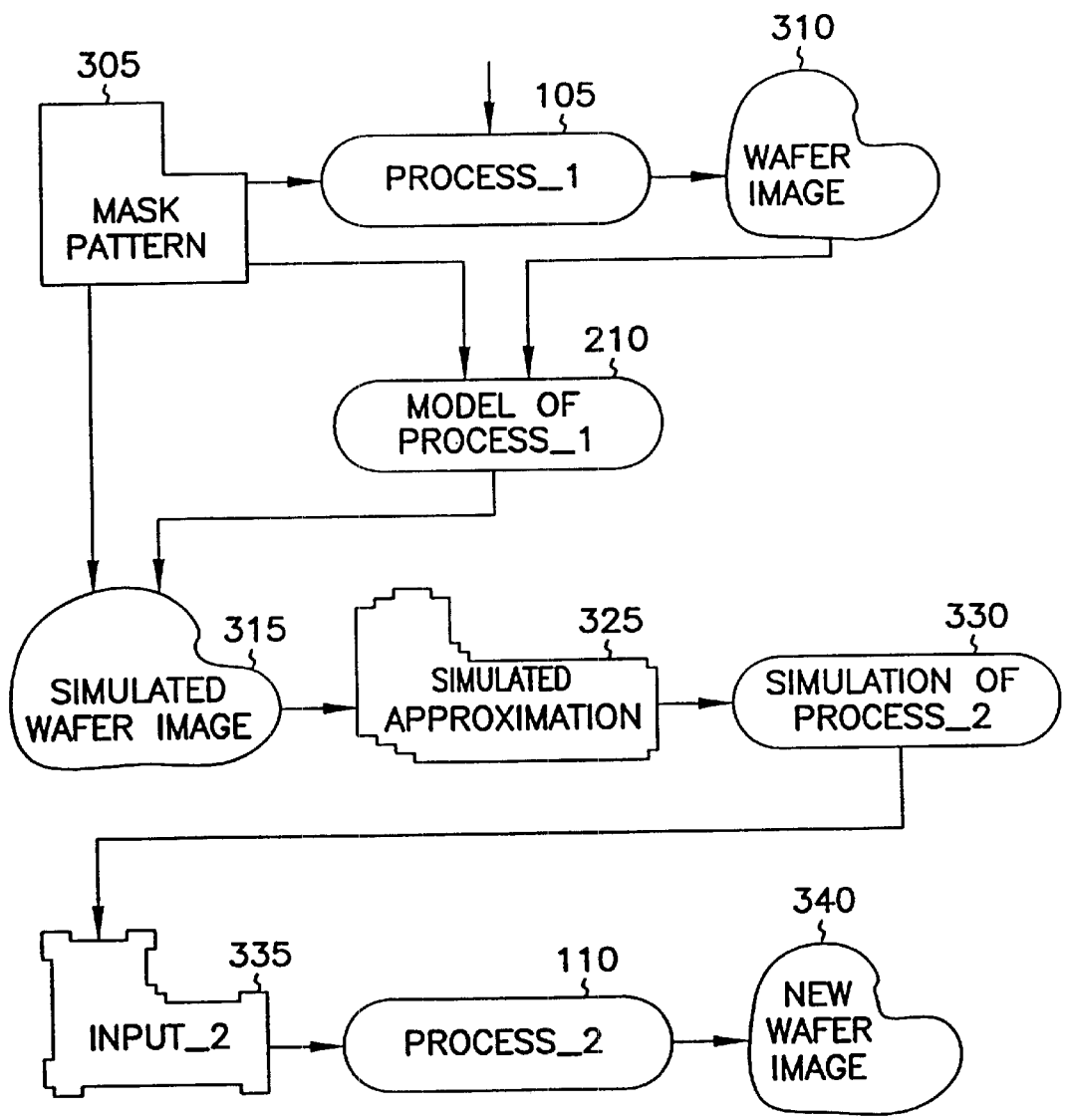
FIG. 3 is an illustration of the matching of the wafer image after a process change by simulation and proximity effect correction.

FIG. 3 illustrates the use of this process matching in photolithography. Here, process_1 105 uses mask pattern 305 to produce wafer image 310. Thus, compared to FIG. 1, mask pattern 305 is input_1 115 and wafer image 310 is output_1 125.

A model of process_1 210 can be created. This model can be used to generate a simulated wafer image 315 from the mask pattern 305 at a given contour level. The contour level ranges from 0 (representing chrome) to 1 (representing quartz). Then, in order to reduce the amount of data and to ease later corrections, a simulation approximation 325 may be generated of simulated wafer image 315.

When a new process_2 110 is introduced, models of process_2 can be generated 220. The simulation approximation data 325 is used as input to an OPC correction (e.g., process_2$_{sim}$ 330). The output from this step 335 is used as input to process_2 110 to gain a new wafer image 340. This new wafer image 340 is equivalent to the original wafer image 310, but it has the desired parameters values found in wafer images produced by process_1 105 as well as the desired parameter values found in wafer images produced by process_2 110.

Figure 4:
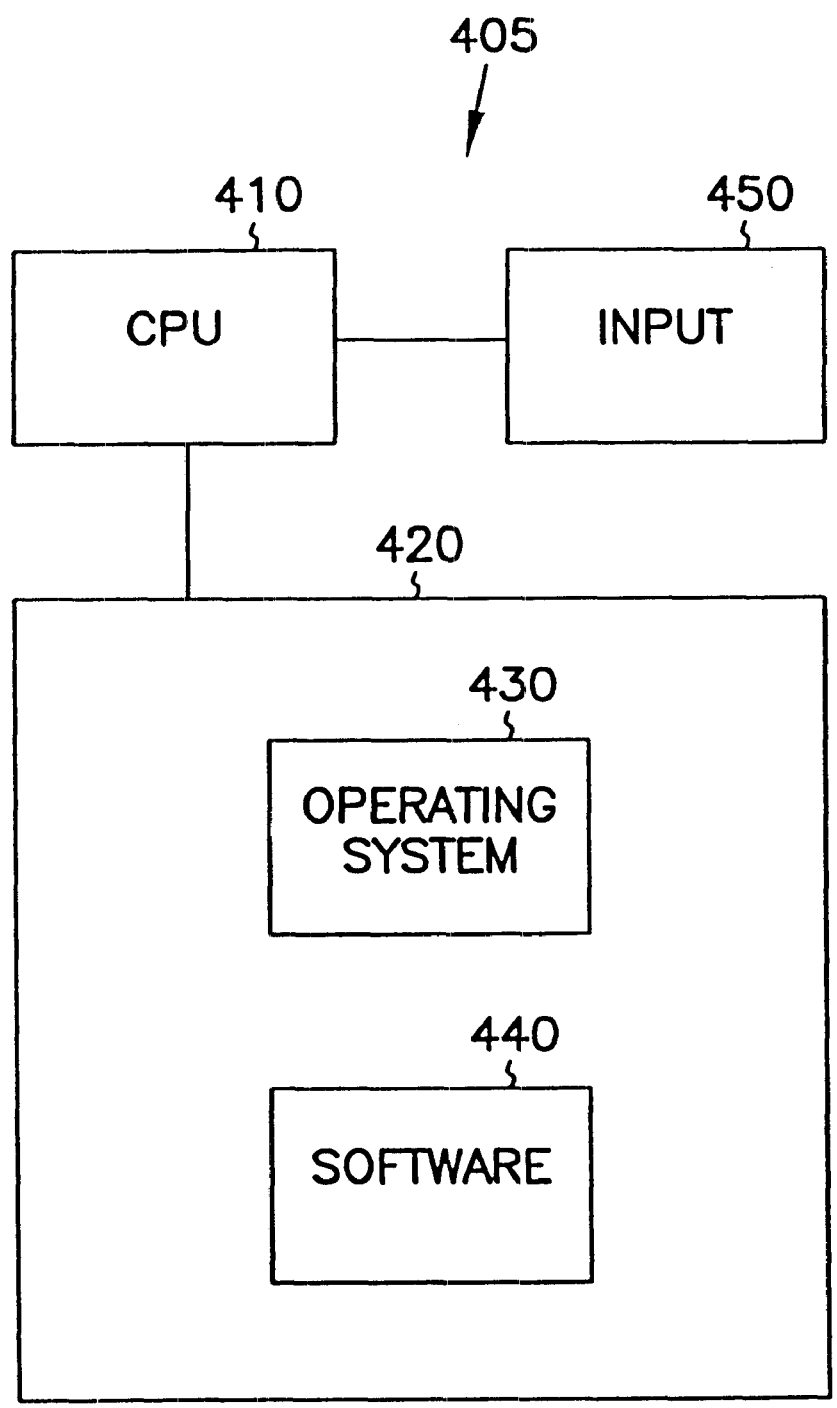
FIG. 4 is a block diagram of a computer system which produces process matching.

FIG. 4 shows a computer system 405 which can implement the process matching method previously described. In FIG. 4, computer system 405 includes a central processing unit 410 and memory 420. Memory 420 can be RAM, disk storage, CD-ROM storage, or other type of memory. Within memory 420, computer system 410 has access to its operating system 430 and user software 440. To implement the method of the present invention, user software 440 can include software from Precim Company along with user-modified scripts. Or, user software 440 can be user-developed software, or software from some other vendor. Computer system 410 accepts input from input devices 450. Wafer image 310 can also be generated by software, such as FAIM from Vector Technologies (Brookline, Mass.), DEPICT from Technology Modeling Associates, Inc. (Sunnyvale, Calif.), and SPLAT by the University of California (Berkeley, Calif.). User software 440 also includes software which generates models (theoretical or empirical).

Other embodiments of the present invention are possible. For example, in addition to photolithography masks, the present invention can be used with x-ray masks, stencil masks for ion projection lithography, or electron beam projection lithography masks. In addition to photolithography, the present invention's method can be used for other processes for which output can be evaluated based upon one or more types of parameters.

We claim:

1. A computer system, comprising:

means for generating a first model and a second model for a first and second parameter, respectively, wherein the parameters measure a characteristic of a first output of a first photolithographic process and of a second output of a second photolithographic process;

means for generating a first simulated output of the first photolithographic process by using the first model;

means for applying a correction to the first simulated output to obtain a corrected output, wherein the correction is a function of the second model and wherein the correction compensates for the effect of the second photolithographic process on the second parameter; and means for applying the second photolithographic process to the corrected output generating thereby a third output matching the first parameter of the first output.

2. The computer system according to claim 1, wherein the first and second photolithographic processes are applied to a mask.

3. An apparatus, comprising:

a computer readable medium having computer readable program code embodied thereon, the computer readable program code, when executed, implementing on a computer a method for matching parameters of generated outputs of a first photolithographic process and a second photolithographic process, wherein the first photolithographic process generates a first output having a characteristic measurable by a first parameter, and wherein the second photolithographic process generates a second output having the characteristic measurable by a second parameter, the method comprising the steps of:

generating a first model of the first parameter for the first photolithographic process;

generating a second model of the second parameter for the second photolithographic process;

generating a first simulated output of the first photolithographic process using the first model;

applying a correction to the first simulated output to obtain a corrected output, wherein the correction is a function of the second model and wherein the correction compensates for the effect of the second photolithographic process on the second parameter; and applying the second photolithographic process to the corrected output generating thereby a third output matching the first parameter of the first output.

4. In the apparatus, as recited in claim 3, the computer readable medium further having computer readable program code, when executed, implementing on a computer a method further comprising the step of generating from the corrected output a second simulated output for verification.

5. In the apparatus, as recited in claim 3, wherein the first and second outputs are wafer images.

6. A computer program product, comprising:

a computer usable medium having a computer readable code means embodied therein for matching parameters of a first and second output of a first photolithographic process and second photolithographic process, comprising:

computer readable program code means for generating a first output from a first photolithographic process having a characteristic measurable by a first parameter;

computer readable program code means for generating a second output from a second photolithographic process having a characteristic measurable by a second parameter;

computer readable program code means for generating a first model of the first parameter for the first photolithographic process;

computer readable program code means for generating a second model of the second parameter for the second photolithographic process;

computer readable program code means for generating a first simulated output of the first photolithographic process using the first model;

computer readable program code means for applying a correction to the first simulated output to obtain a corrected output, wherein the correction is a function of the second model and wherein the correction compensates for the effect of the second photolithographic process on the second parameter; and computer readable program code means for applying the second photolithographic process to the corrected output generating thereby generating a third output matching the first parameter of the first output.

7. The computer program product of claim 6, further comprising a computer readable program means for generating from the corrected output a second simulated output for verification.

8. The computer program product of claim 6, wherein the computer readable program code means for applying a correction further comprises a computer readable program means for applying an optical proximity correction.

9. The computer program product of claim 6, wherein the computer readable program code means for applying a correction further comprises a computer readable program means for applying a topography effect correction.

10. The computer program product of claim 6, wherein the first and second outputs are wafer images.

11. A computer program product, comprising:

a computer usable medium having a computer readable code means embodied therein for performing a method of matching parameters of generated outputs of a first ion projection process and a second ion projection process, the method comprising:

generating a first output from the first ion projection process having a characteristic measurable by a first parameter;

generating a second output from the second ion projection process having a characteristic measurable by a second parameter;

generating a first model of the first parameter for the first ion projection process;

generating a second model of the second parameter for the second ion projection process;

generating a first simulated output of the first ion projection process using the first model;

applying a correction to the first simulated output to obtain a corrected output, wherein the correction is a function of the second model and wherein the correction compensates for the effect of the second ion projection process on the second parameter; and applying the second ion projection process to the corrected output thereby generating a third output matching the first parameter of the first output.

12. The computer program product of claim 11, further comprising generating from the corrected output a second simulated output for verification.

13. The computer program product of claim 11, wherein the first and second ion projection processes are applied to a stencil mask.

14. A computer program product, comprising:

a computer usable medium having a computer readable code means embodied therein for performing a method for matching parameters of generated outputs of a first x-ray projection process and a second x-ray projection process, the method comprising:

generating a first output from the first x-ray projection process having a characteristic measurable by a first parameter;

generating a second output from the second x-ray projection process having a characteristic measurable by a second parameter;

generating a first model of the first parameter for the first x-ray projection process;

generating a second model of the second parameter for the second x-ray projection process;

generating a first simulated output of the first x-ray projection process using the first model;

applying a correction to the first simulated output to obtain a corrected output, wherein the correction is a function of the second model and wherein the correction compensates for the effect of the second x-ray projection process on the second parameter; and applying the second x-ray projection process to the corrected output thereby generating a third output matching the first parameter of the first output.

15. The computer program product of claim 14, further comprising generating from the corrected output a second simulated output for verification.

16. The computer program product of claim 15, wherein the first and second x-ray projection processes are applied to a mask.

17. A computer program product, comprising:

a computer usable medium having a computer readable code means embodied therein for performing a method for matching parameters of generated outputs of a first e-beam projection process and a second e-beam projection process, the method comprising:

generating a first output from the first e-beam projection process having a characteristic measurable by a first parameter;

generating a second output from the second e-beam projection process having a characteristic measurable by a second parameter;

generating a first model of the first parameter for the first e-beam projection process;

generating a second model of the second parameter for the second e-beam projection process;

generating a first simulated output of the first e-beam projection process using the first model;

applying a correction to the first simulated output to obtain a corrected output, wherein the correction is a function of the second model and wherein the correction compensates for the effect of the second e-beam projection process on the second parameter; and applying the second e-beam projection process to the corrected output thereby generating a third output matching the first parameter of the first output.

18. The computer program product of claim 17, further comprising generating from the corrected output a second simulated output for verification.

19. The computer program product of claim 17, wherein the first and second x-ray projection processes are applied to a mask.

20. A computer comprising:

a central processing unit; and a computer readable medium having computer executable instructions stored thereon, the computer executable instructions for execution by the central processing unit and for causing the computer to execute a method of matching parameters of a first and second output of a first photolithographic process and second photolithographic process, the method comprising:

generating a first output from a first photolithographic process having a characteristic measurable by a first parameter;

generating a second output from a second photolithographic process having a characteristic measurable by a second parameter;

generating a first model of the first parameter for the first photolithographic process;

generating a second model of the second parameter for the second photolithographic process;

generating a first simulated output of the first photolithographic process using the first model;

applying a correction to the first simulated output to obtain a corrected output, wherein the correction is a function of the second model and wherein the correction compensates for the effect of the second photolithographic process on the second parameter; and applying the second photolithographic process to the corrected output generating thereby generating a third output matching the first parameter of the first output.

21. The computer of claim 20, further comprising computer executable instructions for generating from the corrected output a second simulated output for verification.

22. The computer of claim 20, wherein applying a correction further comprises a computer readable program means for applying an optical proximity correction.

23. The computer of claim 20, wherein applying a correction further comprises a computer readable program means for applying a topography effect correction.

24. The computer of claim 20, wherein the first and second outputs are wafer images.

* * * * *